(12) United States Patent
Moriceau et al.

(10) Patent No.: US 7,541,263 B2
(45) Date of Patent: Jun. 2, 2009

(54) METHOD FOR PROVIDING MIXED STACKED STRUCTURES, WITH VARIOUS INSULATING ZONES AND/OR ELECTRICALLY CONDUCTING ZONES VERTICALLY LOCALIZED

(75) Inventors: Hubert Moriceau, Saint Egreve (FR); Christophe Morales, Vizille (FR); Marc Zussy, St Egreve (FR); Jerome Dechamp, Saint-Egreve (FR)

(73) Assignee: Commissariat a l'Energie Atomique, Paris (FR)

( * ) Notice: Subject to any disclaimer, the term of this patent is extended or adjusted under 35 U.S.C. 154(b) by 29 days.

(21) Appl. No.: 11/576,259

(22) PCT Filed: Oct. 6, 2005

(86) PCT No.: PCT/FR2005/050825

§ 371 (c)(1),
(2), (4) Date: Mar. 29, 2007

(87) PCT Pub. No.: WO2006/037933

PCT Pub. Date: Apr. 13, 2006

(65) Prior Publication Data

US 2007/0259528 A1    Nov. 8, 2007

(30) Foreign Application Priority Data

Oct. 6, 2004    (FR)    .................... 04 52283

(51) Int. Cl.
*H01L 21/30*    (2006.01)
*H01L 21/46*    (2006.01)

(52) U.S. Cl. ........................ 438/459; 438/406; 438/761; 257/E21.24; 257/E21.57

(58) Field of Classification Search ................. 438/406, 438/459, 437, 435, 761, 977, 967, 928; 257/E21.24, 257/E21.249, E21.561, E21.567, E21.568, 257/E21.57

See application file for complete search history.

(56) References Cited

U.S. PATENT DOCUMENTS

| 5,238,865 A | 8/1993 | Eguchi |
| 6,027,958 A | 2/2000 | Vu et al. |

(Continued)

FOREIGN PATENT DOCUMENTS

FR    2 830 681    4/2003

(Continued)

OTHER PUBLICATIONS

Q. Y. Tong, et al., "Semiconductor Wafer Bonding, Science and Technology", The Electrochemical Society Series, 1999, 159 Pages.

(Continued)

*Primary Examiner*—Caridad M Everhart
(74) *Attorney, Agent, or Firm*—Oblon, Spivak, McClelland, Maier & Neustadt, P.C.

(57) ABSTRACT

The invention relates to a method for producing a semiconducting structure on a semiconducting substrate, one surface of which has a topology, this method including:
a) a step for forming a first layer (24) in a first insulating material on said surface,
b) a step for forming a second layer in a second insulating material (28), less dense than the first insulating material, with a thickness between 2.5 p and 3.5 p,
c) a step for planarization of the assembly.

57 Claims, 6 Drawing Sheets

U.S. PATENT DOCUMENTS

| | | | |
|---|---|---|---|
| 6,127,244 A * | 10/2000 | Lee | 438/458 |
| 6,479,328 B1 * | 11/2002 | Kim | 438/149 |
| 6,613,643 B1 * | 9/2003 | Krishnan et al. | 438/406 |
| 6,955,971 B2 | 10/2005 | Ghyselen et al. | |
| 2004/0150067 A1 * | 8/2004 | Ghyselen et al. | 257/506 |

FOREIGN PATENT DOCUMENTS

| | | |
|---|---|---|
| FR | 2 847 077 | 5/2004 |
| WO | WO 2004/044975 | 5/2004 |

OTHER PUBLICATIONS

A. J. Auberton-Hervé, et al., "Why Can Smart Cut® Change the Future of Microelectronics?", International Journal of High Speed Electronics and Systems, vol. 10, No. 1, 2000, pp. 131-146.

* cited by examiner

METHOD FOR PROVIDING MIXED STACKED STRUCTURES, WITH VARIOUS INSULATING ZONES AND/OR ELECTRICALLY CONDUCTING ZONES VERTICALLY LOCALIZED

TECHNICAL FIELD AND PRIOR ART

The invention relates to the field of semiconductor-on-insulator type structures, such as for silicon-on-insulator also designated as SOI, structures.

In these technologies, a substrate of material, generally a semiconducting material, supports a buried insulator film, for example in silicon dioxide, and a film of superficial semiconducting material.

Producing such semiconductor-on-insulator structures is possible by means of several technologies, such as for example described in the book of Q. Y. Tong and U. Gösele, <<Semiconductor wafer bonding, Science and technology >>, Ed. The Electrochemical Society Series, 1999:

- by means of methods based on implanting oxygen in a semiconducting material and on heat treatment(s) at high temperatures (methods of the SIMOX type),
- by means of methods based or molecular bonding and with, for example, i.e.:
  - mechanical and/or chemical thinning (methods of the BSOI type,
  - mechanical thinning and chemical etching with etch-stop on a sacrificial layer (methods of the BESOI type),
  - making porous embrittlement area(s), prior to molecular bonding, with a view to subsequent separation,
  - implanting gas species in a semiconductor wafer prior to molecular bonding, in order to generate an embrittled area therein with a view to subsequent fracture.

The invention mainly relates to the field of methods based on molecular bonding and to structures made by such methods.

Figure 1A:
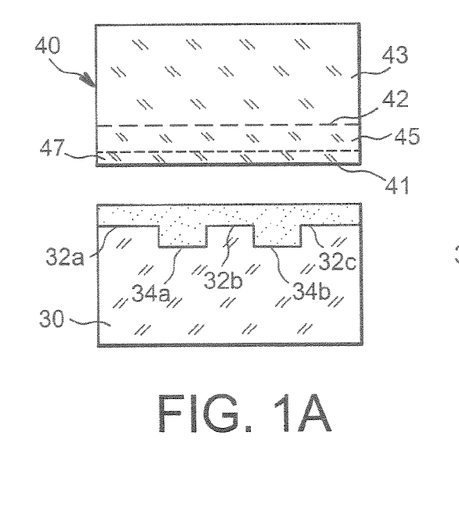
Figure 1B:
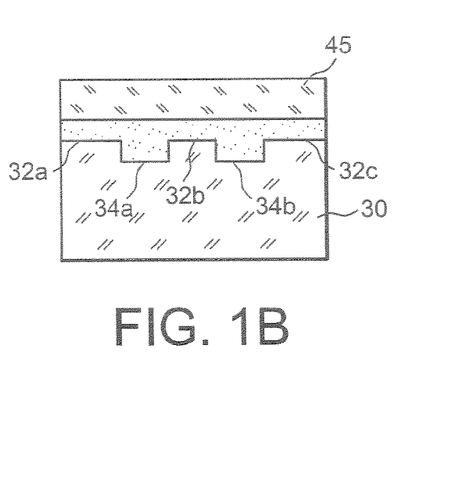
Figure 2A:
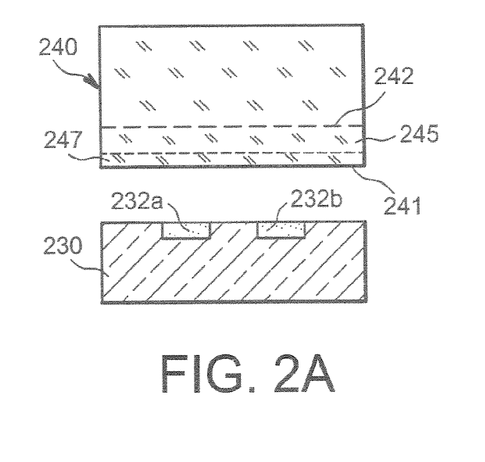
Figure 2B:
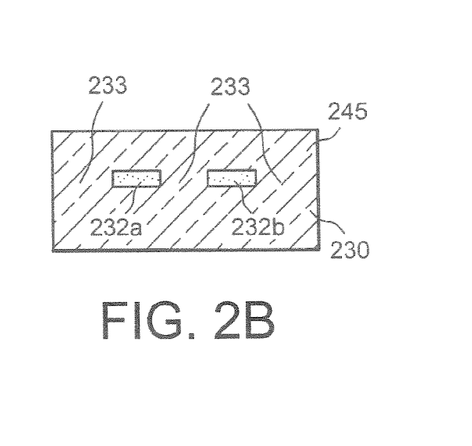

Various needs are expressed:

1) The possibility of having on a same semiconducting structure 230, as illustrated in FIG. 2B, areas 233 with vertical conduction (analogous in its behavior to a bulk, epitaxial semiconductor, etc . . . .), which separate vertically electrically insulated areas 232a, 232b, of the substrate, 2) the possibility of locally having, as illustrated in FIG. 1B, SOIs 30 with very fine buried oxide areas 32 b, 32b, 32c and SOIs with thicker buried oxide areas 34a, 34b.

3) the possibility of locally having vertical conduction areas, SOI areas with fine buried oxides and SOI areas with thicker buried oxides and variable thicknesses.

4) the possibility of having SOIs with more than two thicknesses of buried oxide.

Document FR-2847077 discloses the possibility of making surface-structured silicon wafers, so that areas for example including thick oxides 34a, 34b (FIG. 1A) alternate with fine oxide areas 32a, 32b, 32c, or else oxide areas 232a, 232b alternate with areas 233 without any oxide, i.e., in virgin silicon (FIG. 2A).

According to an exemplary method described in document FR-2 847 077, insulating areas or layers (the example of silicon oxide $SiO_2$ will be assumed) 32a, 32b, 32c, 34a, 34b with different thicknesses are produced in a first semiconducting substrate 30 (the example of silicon will be assumed). Different techniques may be applied for producing these insulating areas. They will be described further on, in connection with FIG. 3A and the following figures.

Such structured wafers may then be bonded by molecular bonding on virgin silicon wafers 40 or on oxidized silicon wafers, the oxide layer of which 47 has a small thickness.

More specifically, in the second semiconducting substrate 40, an atomic or ionic implantation is achieved which forms a thin layer 42 which extends substantially parallel to a surface 41 of the substrate 40. In fact, a layer or an embrittlement or fracture plane is thereby formed which delimits, in the volume of the substrate 40, a lower region 45 intended to form a thin film and an upper region 43 forming the bulk of the substrate 40. This implantation generally is an implantation of hydrogen, but it may also be performed by means of other species, or even with H/He co-implantation.

Both of the thereby prepared substrates 30 and 40 are then assembled by a technique of the "wafer bonding" type or by contact of the adherent type, for example by molecular adhesion or by bonding. As regards these techniques, reference may be made to the book of Q. Y. Tong and U. Gosele <<Semiconductor Wafer Bonding>> (Science and Technology), Wiley Interscience Publications.

A portion of the substrate 40 is then detached by a treatment with which a fracture along the embrittlement plane 42 may be produced. An example of this technique is described in the article of A. J. Auberton-Hervé et al. <<Why can Smart-Cut change the future of microelectronics?>> published in the International Journal of High Speed Electronics and Systems, Vol. 10, No. 1 (2000) p. 131-146.

A semiconducting component or element or a semiconducting structure according to FIG. 1B is thereby formed.

According to still another embodiment illustrated in FIGS. 2A and 2B, a first substrate is a bulk semiconducting (for example: silicon) substrate 230 in which insulating areas (for example: $SiO_2$) 232a, 232b are produced beside areas of bulk silicon.

In a second substrate 240, an embrittlement layer 242 similar to the layer 42 described above, is generated by atomic or ionic implantation, for example with hydrogen ions. This embrittlement layer delimits, in the volume of the substrate 240, the thin layer 245.

Both thereby prepared substrates 230 and 240 are then assembled by one of the techniques already mentioned above ("wafer bonding" or bonding or contacting of the adherent type, for example by molecular adhesion).

The portion of the substrate 240, located on the side opposite to the face 241 for assembling the substrates, is then eliminated or detached, as already described above in connection with FIG. 1B.

A semiconducting component or element or a mixed planar semiconducting structure is thereby formed according to the structure of FIG. 2B, having an alternation (or any other form of juxtaposition or distribution) of insulating areas 232a, 232b (here: $SiO_2$), which may have thicknesses different from each other and semiconductor or bulk silicon areas.

Various electronic components may then be produced in the surface layers 45, 245 of semiconductor or silicon, notably in the portion of the layer located above the insulator or silicon oxide areas.

Producing structures such as the substrate 30 of FIG. 1A and the substrate 230 of FIG. 2A, according to the teaching of document FR 2 847 077, notably involves the following steps, illustrated in FIGS. 3A-3E or 4A-4C.

Figure 3A:
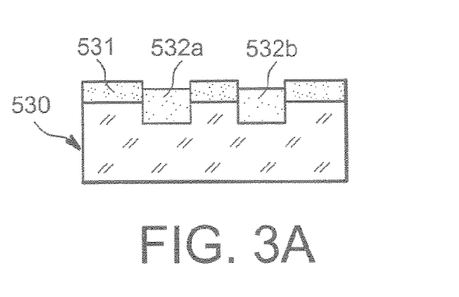

In FIG. 3A, silicon dioxide areas 532a, 532b are produced on a substrate 530 by growth with the LOCOS ("Local Oxidation of Silicon" method through a mask 531. These areas may have the shape of pads or strips or more complex shapes.

The mask is then removed (FIG. 3B), leaving silicon oxide areas 532a, 532b.

A planarization step by chemical-mechanical polishing (FIG. 3C) is then performed, which leads to a substrate having silicon dioxide areas 534a, 534b, juxtaposed to the silicon of the actual substrate. This substrate is for example the one used in FIG. 2A.

Figure 3B:
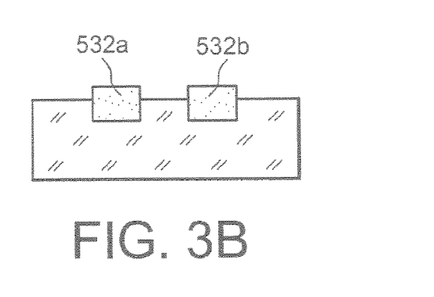
Figure 3C:
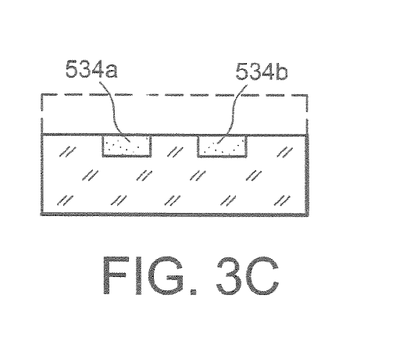
Figure 3D:
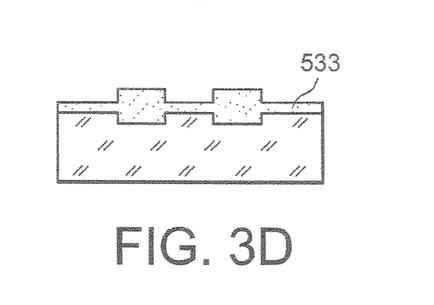
Figure 3E:
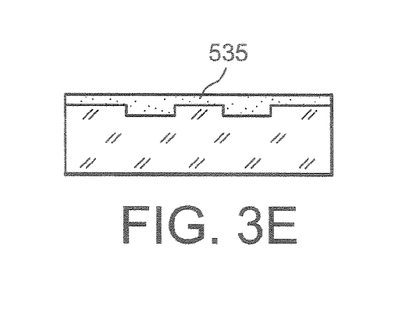

According to one alternative (FIG. 3D), a surface oxidation layer 533 of the substrate is produced from the structure of FIG. 3B and then FIG. 3E) the assembly is planarized by chemical-mechanical polishing, in order to leave a surface oxidation layer 535.

A layer of a few hundreds of nanometers (for example 300 nm) may thereby be removed, leaving juxtaposition of silicon dioxide areas with different thicknesses. This type of substrate is used in FIG. 1A above.

Figure 4A:
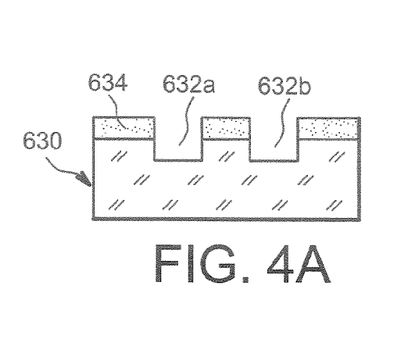
Figure 4B:
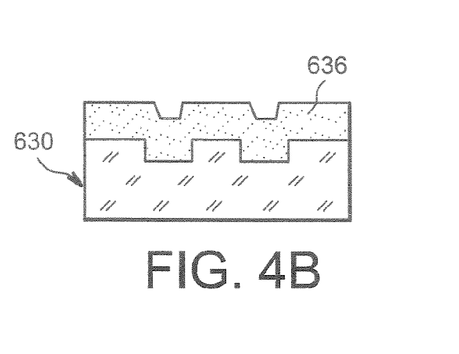
Figure 4C:
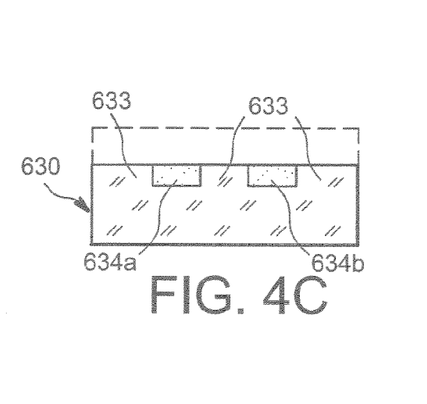

Another method which may be applied is illustrated in FIGS. 4A-4c.

In FIG. 4A, trenches 632a, 632b are etched, for example by dry etching, through a mask 634, in a silicon substrate 630.

The mask is then removed (FIG. 4B), and then the substrate is thermally oxidized at the surface, or else a silicon dioxide layer is deposited, forming a silicon dioxide layer 636.

A planarization step by chemical-mechanical polishing (FIG. 4C) is then performed, which leads to a substrate having silicon dioxide areas 634a, 634b juxtaposed to the silicon 633 of the actual substrate. This substrate for example is the one used in FIG. 2B.

Figure 4D:
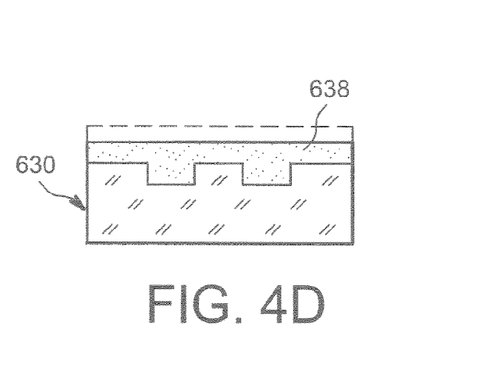

According to one alternative (FIG. 4D), the assembly of FIG. 4B is flattened, but less than in the case of FIG. 4c, leaving a silicon dioxide layer 638. Juxtaposition of silicon dioxide areas of different thicknesses at the surface of the silicon substrate 630 is thereby achieved. This type of substrate is used in FIG. 1A above.

To summarize, these techniques apply:
- a first lithographic step for producing a mask (for example in nitride) with a view to localized oxidation of the wafer,
- a second step for oxidizing open areas on the mask (FIG. 3A) and also if need be, the other areas (FIG. 4B), by an oxidizing thermal treatment,
- a third step for reducing the surface topology by a chemical-mechanical polishing technique.

This step is stopped according to the structure to be produced, according to whether one seeks to obtain at the surface of the silicon wafer, an alternation of areas with fine oxide and of areas with thicker oxide, or an alternation of virgin silicon and silicon oxide.

Whichever the one of these methods which is applied, it requires thinning by chemical-mechanical polishing, which proves to be a critical step.

Figure 5A:
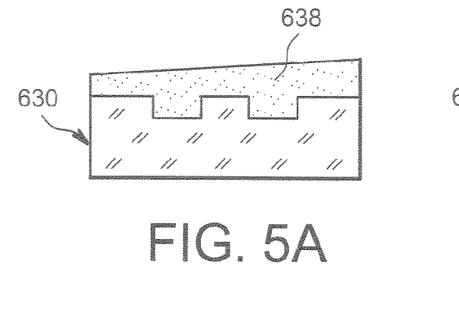

As illustrated in FIG. 5A, this step may induce a lack of thickness homogeneity in different points of the wafer, this lack of homogeneity in particular is proportional to the removed thickness.

This problem is encountered as soon as a substrate such as the one of FIG. 3B or 3D or the one of FIG. 4B is subject to chemical-mechanical polishing.

It is therefore difficult with this thinning polishing technique, to find operating conditions with which areas with fine oxide may be obtained, the thickness of which is homogenous over the whole silicon wafer or even simply in various points of the silicon wafer.

Further, this chemical-mechanical polishing step is also critical when it is carried out at the same time on two different materials, for example silicon and silicon oxide as in the case of the substrate of FIG. 3B or FIG. 4B so as to end up with the structure of FIG. 3C or 4C respectively.

Figure 5B:
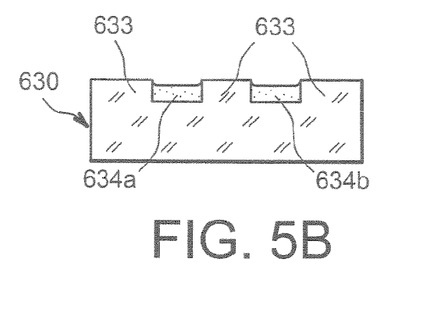

Indeed, as illustrated in FIG. 5B, it is then delicate to avoid differential polishing (dishing) between the areas 633 having a semiconductor at the surface and the areas 634a, 634b having an oxide at the surface: the level of these different areas is not uniform. In FIG. 5B, the oxide areas are <<recessed>> relatively to the semiconductor material areas. In the case when the semiconductor is silicon and silicon oxide $SiO_2$, <<recesses>> will on the contrary be obtained at the silicon because chemical-mechanical polishing is more effective on Si than on $SiO_2$.

In both cases, there results a surface which may pose problems with regard to possible molecular bonding.

The problems discussed above in the case of a silicon/silicon oxide $SiO_2$ system are also posed with other semiconducting materials and other insulating materials.

There is therefore the problem of producing such semiconducting material wafers having a structured surface, therefore either having variable thicknesses of insulator as in FIG. 1A, or alternations of insulating material and semiconducting material, as in FIG. 2A, and compatible with bonding by subsequent molecular adhesion.

It is notably sought that the homogeneity in thickness of the insulating films in the fine insulating areas should be correct.

It is also sought that a minimum of topology should be present at the surface (and therefore a minimum dishing or difference of levels between the insulator areas and the semiconductor areas, as explained above), in particular when there is an alternation, at the surface, of virgin semiconductor and insulator.

The problem is posed of producing such structures without resorting to a long step of chemical-mechanical polishing which poses the problems discussed above in connection with FIGS. 5A and 5B

DISCUSSION OF THE INVENTION

The invention first relates to a method for producing a semiconducting structure on a superconductor substrate, one surface of which has surface topology, or patterns with different or variable heights at the surface, this method including:
a) a step for forming a first layer on a first insulating material on said surface,
b) a step for forming a second layer in a second insulating material, less dense than the first insulating material,
c) a step for thinning the assembly.

According to the invention, a second less dense layer and with limited thickness is used over the first insulator layer, whereby the inhomogeneities which appear during standard polishing with a larger insulator thickness, may be strongly limited.

The topology, or even the relief, at the surface of the semiconducting structure, may have a characteristic depth p, and the second insulating material layer may have a thickness between 2 p and 2.5 p.

The topology may be formed with patterns etched in the substrate, separated by trenches.

These etched patterns for example have a depth between 1 μm and 10 μm and/or a width between 1 μm and 5 mm.

The substrate may be a composite substrate, for example of the type including an insulating film at the surface.

According to an embodiment, the first insulator layer is a layer in accordance with the topology of the substrate.

Step c) may leave a first insulator layer on the surface.

Further, an additional thinning step may be provided, leaving an alternation of semiconducting areas and insulating areas on the surface.

Before leveling, a step for densifying the second insulating material may be provided.

The first insulator layer is preferably a layer in accordance with the topology of the substrate.

The first insulating material may be $SiO_2$ thermal oxide, and the second insulator material, $SiO_2$ oxide, deposited for example by plasma vapor phase deposition.

According to other examples, the insulating material is in $Al_2O_3$, or AlN, or SiON, or $Si_3N_4$, or diamond or $HfO_2$, or a dielectric material with a high dielectric constant.

The semiconducting material may be in silicon or in $Si_{1-x}Ge_x$ (0<x<1) or in another semiconducting material.

The invention also relates to a method for producing a semiconducting structure, on a semiconducting substrate having pads in a first insulating material protruding from the surface of the substrate, this method including:

a) a step for forming a layer of a second insulating material, less dense than the first insulating material, b) a step for thinning the assembly.

The different materials (insulators, semiconductors), may be the ones already indicated above.

The pads may be formed in etched areas of the semiconducting substrate.

They may be formed by thermal oxidation of the semiconducting substrate.

They may also be formed by LPCVD, and the second insulating material layer in PECVD.

Step b) may leave a layer of second insulating material at the surface, or else an alternation of second insulating material areas and first insulating material areas.

A method according to the invention may be reiterated, in order to form insulating areas with different geometrical characteristics and/or different compositions. For example, with masks different from one step to the other, it is possible to define patterns of different topology from one step to the other.

An assembly step with a second substrate may be provided, for example by molecular adhesion.

The second substrate may itself be in a second semiconducting material, with possibly additionally a surface insulator layer.

The first substrate may have at least one area with a first conductivity type, and the second substrate an area with an opposite conductivity type.

A step for thinning the first and/or the second substrate may further be performed, for example by forming an embrittlement layer or area.

An embrittlement layer or area may be produced by a porous silicon or semiconductor layer, or by implanting ions in the first or the second substrate, for example hydrogen ions or a mixture of hydrogen ions and helium ions.

The thinning step may also be obtained by polishing or etching.

The first substrate may include areas with different dopings, for example areas with a first type of conductivity in certain areas and areas with a second type of conductivity in other areas.

SHORT DESCRIPTION OF THE DRAWINGS

FIGS. 1A-5B illustrate known techniques and the problems posed by these techniques, FIGS. 10A-13B illustrate other further steps of other methods according to the present invention.

DETAILED DISCUSSION OF PARTICULAR EMBODIMENTS

An exemplary embodiment of the invention will now be given in connection with FIGS. 6A-6E.

In a first step, (FIG. 6A), on a substrate 20 in a first semiconducting material (for example silicon) in which topology or patterns 22 with depth p have been etched, compliant deposition or formation 24 of a first insulator, or example $SiO_2$ thermal oxide, is performed.

Figure 6A:
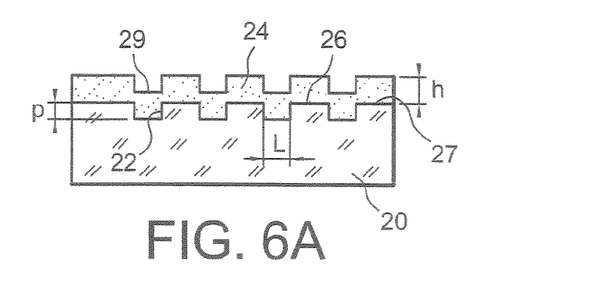
FIGS. 6A-6E illustrate steps of a method according to the invention.

This insulator covers both the trenches 22 formed in the substrate by etched areas and the areas 26 located between these trenches, called bridges. As the deposition is compliant, the patterns of the substrate are found on the upper surface of the layer 24.

The patterns 22 were for example produced by photolithography of a resin at the surface of the wafer 20, followed by etching, for example reactive ionic etching (RIE). The resin is then suppressed on the surface of the conductor wafer.

Preferably, the first insulator is deposited so that the upper surface 29 of the oxide, in the etched patterns or above these patterns, is at least at the height of the interface 27, in the areas of bridges 26, between the semiconducting material and the insulator.

In the case of thermal oxide, the latter is very compliant and therefore reproduces the relief of the silicon surface. It may be considered that the generated oxide height is about at least twice the height of silicon submitted to oxidation.

The thermal oxide 24 as for it is able to provide good electric properties of the interface with the underlying semiconducting material (notably low densities of low energy interface states).

Next (FIG. 6B), a second type 28 of insulator, for example also $SiO_2$ is deposited on the first insulator layer. This second type of insulator is less dense than the first. This may be $SiO_2$ oxide deposited for example by plasma-enhanced chemical vapor deposition (PECVD). At its surface, patterns are present which, without exactly reproducing the initial topology, nevertheless recall the latter.

Figure 6B:
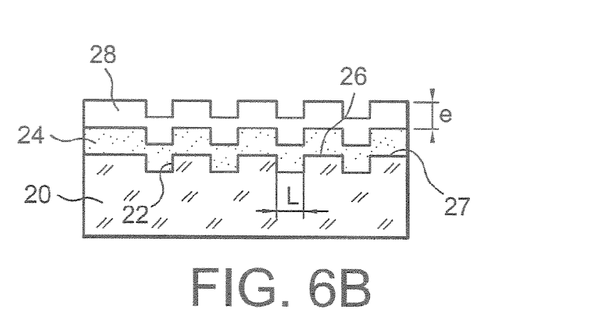

With this second deposited oxide, it is possible to reduce the total thickness, which would be necessary if the intention would have been to level the patterns by chemical-mechanical polishing.

This thickness is reduced to about three times the depth p of the patterns. In other words, the second insulator or oxide is preferably deposited in order to obtain a thickness e less than 3.5 times the depth p or between twice or 2.5 times and 3.5 times the depth p. This ratio is not satisfied in FIG. 6B which is not to scale.

The total thickness formed on the substrate is therefore reduced as compared with the use of a single insulator 24. For example, in the case of a $SiO_2$ thermal oxide insulator, the use of the latter would require a thickness of about 9 times the depth p of the pattern in order to be able to level the topology during a subsequent planarization step, but the thickness inhomogeneities produced during the leveling step are proportional to the removed thickness during polishing, and are therefore about 3 times larger than when a method according to the invention is used.

Next, (FIG. 6C) it is possible to proceed with leveling.

First, it is possible to perform leveling of the topology in the insulator 28, by leaving a fine layer 19 (in dashed lines in FIG. 6C) above the so-called <<mixed>> area, in which both types of insulator are juxtaposed.

Figure 6C:
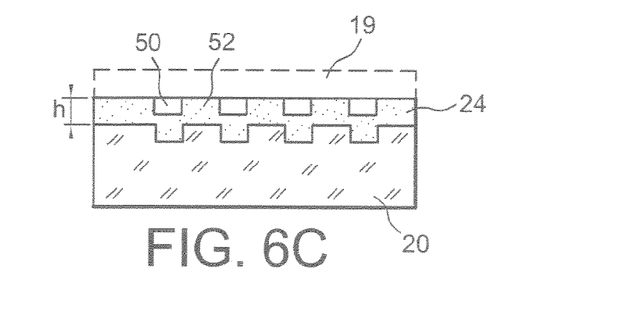

According to an alternative, leveling is performed as far in this mixed area: this is the situation illustrated in solid lines in FIG. 6C. The surface is then an alternation of areas 50 from the deposited oxide layer 28 and of areas 52 of the thermal oxide 24.

The polishing may be performed by chemical-mechanical polishing.

A smoothed surface is then obtained, at a height h above the interface of the thermal oxide and of the semiconducting material, at the base of the bridges 26.

Additional thinning (FIG. 6D) is for example performed by chemical-mechanical polishing or by chemical etching, such as etching with a solution of hydrofluoric acid for example diluted to 1% or 10%, or by plasma ionic etching, such as for example reactive ionic etching.

Figure 6D:
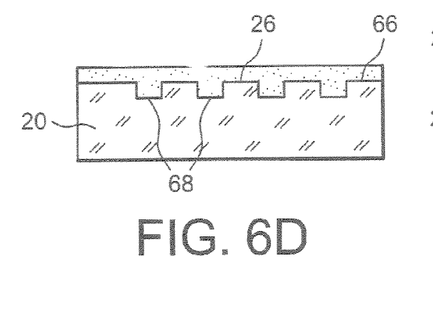

With a view to this additional thinning step, a prior densification step may have been performed, when the difference in thinning rate for the thinning technique used between both types of insulator or oxides (thermal oxide and deposited oxide) is significant, which is the case when thinning produces <<dishing>> larger than a few nanometers (retention of compatibility with subsequent bonding by molecular adhesion is desired). But, in certain cases, for example plasma reactive ionic etching, this difference is reduced and then densification has no substantial effect.

With this optional step for densifying the deposited oxide, it is possible to provide it with a density close to that of the thermal oxide.

If the thinning stops above the level 27, an alternation of thick insulator areas 68 and of thin insulator areas 66 (FIG. 6D) is obtained.

According to an alternative (FIG. 6E), the additional thinning, from the configuration of FIG. 6C, is performed until the silicon-thermal oxide interface 27 is reached at the level of the bridges 26.

Figure 6E:
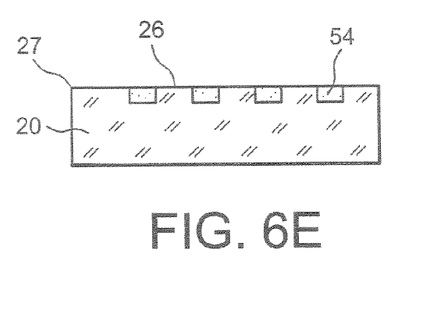

The surface of the wafer is then planar formed by an alternation of silicon areas 26 and of thermal oxide areas 54.

The thereby structured wafer may be cleaned with a view to bonding by molecular adhesion.

Cleaning here and more generally in the whole document means any surface preparation aiming at obtaining totally or partially hydrophilic or hydrophobic surfaces, this preparation may include heat treatments, and/or wet or dry or plasma chemical treatments, or even by CMP flushing (a chemical-mechanical polishing aiming at alleviating the surface micro-roughness, from less than 20 nm or 30 nm, without any risk of <<dishing>>.

The thereby structured and cleaned wafer may then be bonded for example onto a second wafer 60 (FIG. 7A), having possibly undergone a surface treatment, such as the one indicated above with a view to molecular adhesion. This second wafer may be a wafer of virgin semiconductor, for example in silicon) also cleaned with a view to molecular bonding, so as to form a so-called <<partial silicon-on-insulator>>, (PSOI) structure.

Figure 7A:
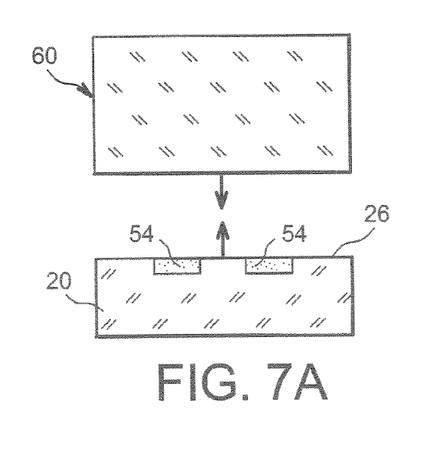
FIGS. 7A-7B illustrate other steps of another method according to the invention.

In order to increase adhesion of the wafers, the stacked structure is for example submitted to a heat treatment. In addition, if the heat treatment is carried out at a high temperature (for example greater than or equal to 1,100° C.) a possible extremely fine residual oxide may be caused to disappear at the bonding interface in the areas corresponding to the bridges. With a view to facilitate disappearance of this possible interface oxide, one will try as much as possible to minimize crystallographic misalignment between two assembled wafers.

Figure 7B:
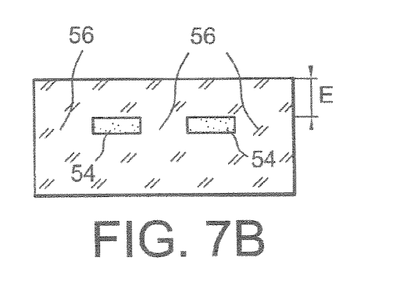

One of the wafers may be thinned in order to obtain the desired thickness E of semiconducting superficial film (FIG. 7B). With this structure it is possible to alternately position vertical conduction areas 56 and SOI areas 54.

According to an alternative, and in order to obtain a second type of stacked structure (FIG. 8B), additional thinning is performed here again until the silicon-thermal oxide interface is reached at the level of the bridges.

The surface of the first wafer is then still planar and formed with an alternation of silicon areas and of thermal oxide areas (FIG. 6E).

The first silicon wafer is bonded onto a second wafer 62 (FIG. 8A), including at the surface, an insulator layer, for example in oxidized silicon (surface oxide layer 64), and also cleaned with a view to molecular bonding, so as to form a so-called <<multisilicon-on-insulator>> (MSOI) structure. In this last approach, the oxide film 64 of the second wafer 62 will advantageously have a fine thickness, between 1 nm and 50 nm, for example. In order to increase adhesion of the wafers, the stacked structure is for example submitted to a heat treatment.

Figure 8A:
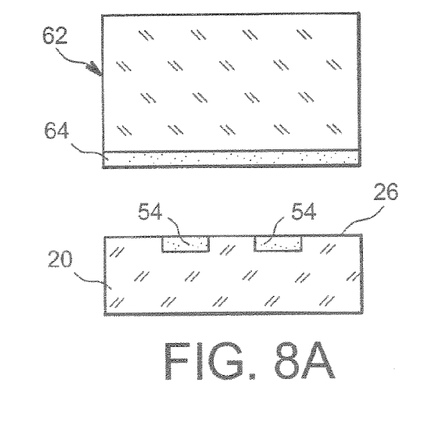
FIGS. 8A and 8B illustrate other further steps of another method according to the invention.
Figure 8B:
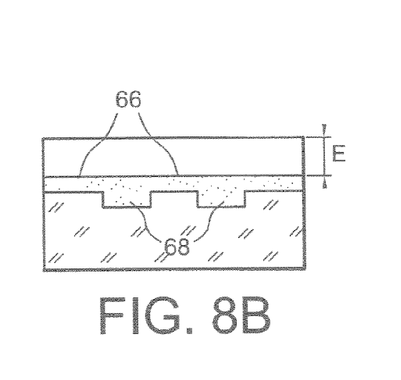

One of the wafers may be thinned in order to obtain the intended silicon surface film thickness (FIG. 8B). With this structure, it is possible to alternately position SOI areas 66, 68 with variable oxide thickness in the case of silicon and $SiO_2$.

According to still another alternative, and in order to obtain a stacked structure of the type of FIG. 8B, additional thinning is performed so as to leave a fine thermal oxide film above the bridges (FIG. 6D).

The surface of the wafer is then planar, formed with an alternation of fine thermal oxide areas 66 and of thicker thermal oxide areas 68. The first thereby structured silicon wafer may be cleaned with a view to bonding by molecular adhesion.

This first silicon wafer may then for example be bonded onto a second wafer such as the wafer 60 (FIG. 7A), for example a wafer in virgin silicon also cleaned with a view to molecular bonding, so as to form a so-called <<multisilicon-on-insulator>> (MSOI) structure, such as the one of FIG. 8B.

In order to increase adhesion of the wafers, the stacked structure is for example submitted to a heat treatment. One of the wafers may be thinned in order to obtain the intended silicon surface film thickness. With this structure, it is possible to alternately position vertical conduction areas and SOI areas, as in FIG. 8B.

With an alternative of this method, it is however possible to produce a PSOI type structure (of the type of FIG. 7B).

Indeed, prior to bonding, the wafer of FIG. 6D consists of thin thermal oxide areas and of thick thermal oxide areas with a planar surface.

It is therefore possible to globally etch this surface in order to run into silicon at the bridges 26, after having removed a silicon oxide thickness corresponding to the thickness of the thin thermal oxide areas. This oxide etching may be performed in different ways: by a chemical solution, by plasma, by ionic bombardment . . .

An etching type is preferably selected, for which the silicon and oxide etching rate difference is as small as possible, so as to avoid causing <<dishing>>, related to the presence at the surface of both silicon and thermal oxide. A low selectivity (etching rate ratio) less than 5 is preferably selected. A solution based on diluted HF, for example 1% HF, is possible, but it is then delicate to control the stopping of the etching. On the other hand, a solution based on $NH_4OH/H_2O_2/H_2O$, has an etching rate ratio of only about 2, which is more easy to use. In the same way ionic bombardment etching has a small etching rate difference.

According to another alternative, and in order to obtain a stacked structure of the type of FIG. 8B, additional thinning is performed so as to leave a fine thermal oxide film above the bridges (FIG. 6D). The surface of the wafer is then planar, formed with an alternation of fine thermal oxide areas 66 and of thicker thermal oxide areas 68.

This first wafer is bonded onto a second wafer 62 (FIG. 9A), for example a second wafer of oxidized silicon (oxide layer 64) and also cleaned with a view to molecular bonding, so as to form a so-called <<multisilicon-on-insulator>> (MSOI) structure, as in FIG. 8B.

Figure 9A:
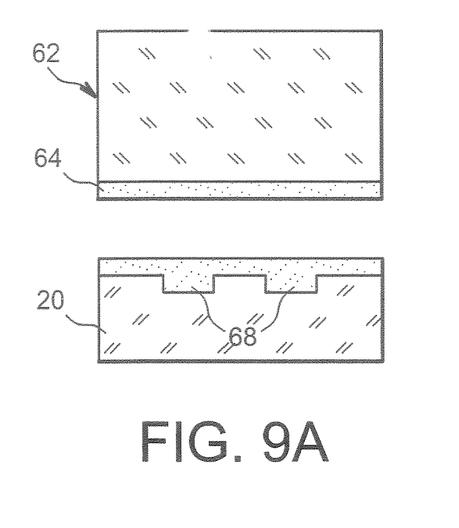
FIGS. 9A and 9B illustrate other further steps of another method according to the present invention.

In this approach, the oxide film of the second wafer will advantageously have a fine thickness, for example between 1 nm and 50 nm.

In order to increase adhesion of the wafers, the stacked structure may for example be submitted to a heat treatment.

Figure 9B:
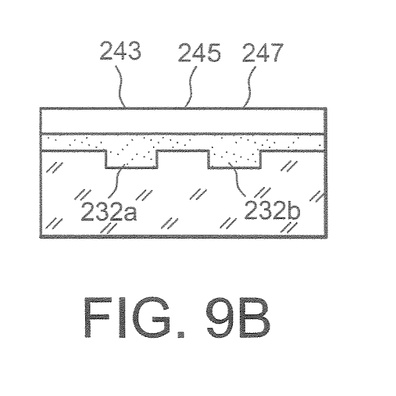

One of the plates may further be thinned in order to obtain the intended surface film thickness. With this structure, it is possible to alternately position SOI areas 66, 68 with variable oxide thickness (FIG. 9B).

A portion of the thickness of one of the two bonded wafers may be reduced, in one of the steps of the method, in order to obtain the proper thickness of the silicon surface film and to produce the desired MSOI or PSOI structures.

This reduction may for example be achieved by one of the following techniques:
- mechanical thinning, for example of the grinding type,
- chemical-mechanical polishing,
- implanting prior to bonding, gas species in the wafer to be thinned and fracture such as used in SmartCut™ technology,
- thinning by ionic and/or chemical etching,
- inclusion prior to bonding of an embrittlement area embedded in the wafer to be thinned (such as a porous area or an ion implantation area, for example implantation of hydrogen or possibly helium),
- or any combination of at least two of these techniques.

Other alternatives of the method described above may be achieved.

For example, the starting wafer 20 may be doped, possibly with various dopings in different areas. For example, there may be a p+ doping at the level of the vertical conduction areas, where there is no insulating area, whereas the other areas have different doping or no doping.

Also, during the assembly with a second wafer (FIGS. 7A and 7B), one of the wafers may be of a doping type (for example n type Si and for example p type Si).

Also, the example of silicon was given above, but a method according to the invention may be applied to semiconductors other than silicon, for the first wafer and/or for the second wafer. For example $Si_{1-x}Ge_x$ with $0 \leq x \leq 1$ or even a multilayer substrate III-V will be mentioned.

Figure 12A:
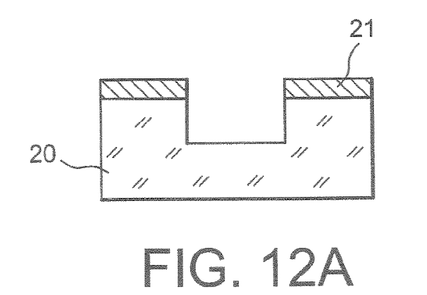
Figure 12B:
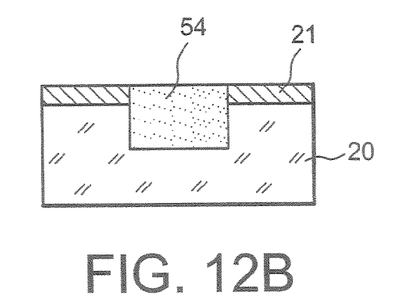

As illustrated in FIG. 12A, the substrate may also be a composite substrate, which may comprise at its surface, an insulator film 21, for example in AlN. This structure may then for example be covered with an LPCVD type deposit considered as a first oxide 24 (FIG. 6A) and on which a second less dense insulator will be added in order to perform smoothing of the topology as already explained above. Finally, a structure such as the one of FIG. 12B, including an alternation of insulators 21, 54, which may have different thermal and/or electric properties, may be obtained. For example, the insulator 21 is an electrical insulator, whilst insulator 54 is an insulator both from the electrical and thermal points of view.

On the second wafer 62 (FIGS. 8A, 9A) the thickness of the insulating film (for example, in fine oxide) 64 may be in the range from 1 nm to a few micrometers, 10 µm for example.

The depth p of the etched pattern 62 may be from a few nanometers to a few micrometers, for example between 1 nm or 5 nm and 1 µm or 3 µm.

The side dimension L of the patterns may typically be in the range from 0.1 µm to a few millimeters, 5 mm for example.

The thickness E of the silicon surface films in the final structures (FIGS. 7B, 8B) may for example be in the range from a few nanometers to a few tens of microns, between 1 nm and 50 µm for example.

In producing the MSOI type structures (FIG. 8B), the fine insulator may also be developed (by deposition or by growth...) on at least one of the two wafers to be bonded after the step for preparing the structured surface.

Figure 13A:
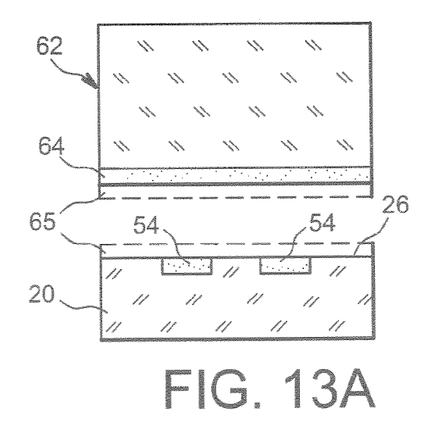
Figure 13B:
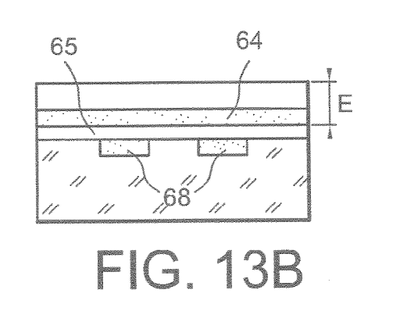

The method may be adapted with insulators other than silicon oxide $SiO_2$, as a fine insulator film developed or formed on the first and/or the second wafer and/or as a fine insulator film 65 developed in an additional step, on a structured wafer and/or on a second assembly wafer 62 as illustrated in FIG. 13A. FIG. 13B illustrates both elements of FIG. 13A after assembly, an insulator film 65 separating the areas 68 and the layer 64.

For example it is possible to mention as insulator, $Al_2O_3$, or AlN, or SiON, or $Si_3N_4$, or diamond or $HfO_2$, or any dielectric with a high coefficient K, etc., or any combination of these materials.

With the method according to the invention, if it is reiterated, it is possible to produce different thicknesses p and/or two different insulator widths L 54 (case of FIG. 6E) in a same substrate, alternating with semiconducting areas.

Areas 54 of a first insulator type and then areas of another insulator type may also be produced.

A semiconducting substrate may therefore be produced with insulating areas which may be different by their geometrical dimensions (depth or width) and/or by the natures of the materials which make them up.

These different insulating areas are obtained by reiterating a method according to the invention, with different masks during different steps for forming the different insulating areas.

A method according to the invention may therefore be reiterated several times on the same first wafer. In the method and in the various exemplary embodiments, steps for strengthening the molecular bonding (specific cleanings of the surfaces, activation of the surfaces by a plasma, bonding under a specific atmosphere, heat treatments...) may be applied.

It is also possible to perform fine polishing of the chemical-mechanical type (touch polishing) in order to improve the micro-roughness of the oxide surfaces. This treatment is considered as a surface treatment (very little removal of material) as opposed to the polishing method with which a topography of the oxide surfaces may be leveled at a large scale.

Figure 10A:
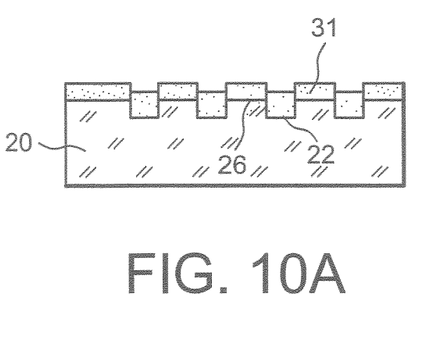
Figure 10B:
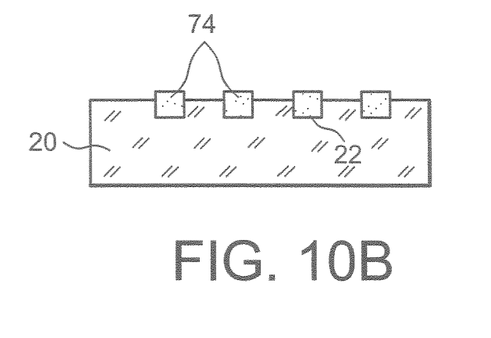
Figure 10C:
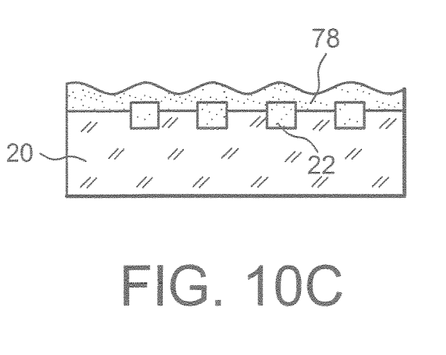

According to another exemplary embodiment illustrated in FIGS. 10A-10C, the bridges 26 of a substrate in semiconducting material, for example silicon, in which patterns 22 of depth p have been etched, are covered with a mask 31.

A first insulator is formed, for example by an LPCVD technique or by thermal oxidation (notably in the case when the substrate is in silicon).

The mask 31 is then removed (FIG. 10B), leaving insulator pads, these pads defining a surface topology of the substrate 20.

It is then possible (FIG. 10C) to perform deposition of a second insulator 78, for example by PECVD deposition, less dense than the material of the pads 74.

If the pads 74 exceed a height h above the substrate, the surface topology will be able to be leveled by depositing a layer with a thickness less than 3.5 h.

With this second deposited insulator 78, the <<dishing>> phenomenon may be avoided, which would have occurred if the intention was to smooth the patterns 74 by chemical-mechanical polishing.

With the second insulator the topology may be leveled by thinning a film of a single nature of material while a direct method would have two materials at the surface.

Figure 10D:
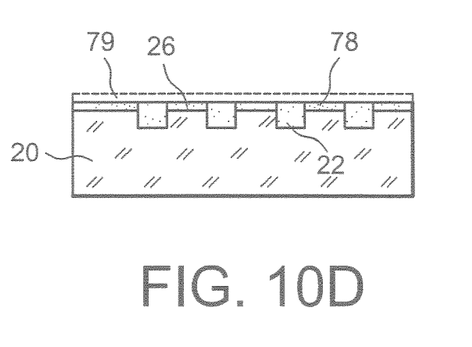

Next, (FIG. 10D) it is possible to proceed with leveling either by leaving a fine layer 79 above the so-called <<mixed>> area (see the layer in dashed lines in FIG. 10D), in which two types of insulator 74, 78 are juxtaposed i.e. as far as in this mixed area: this is the situation illustrated on solid lines in FIG. 10D. The surface is then an alternation of areas from the insulator layer 78 and of areas 74 of the insulator initially formed as pads. These different areas may have different properties, for example from the thermal point of view and/or from the electrical point of view.

Polishing may be carried out by chemical-mechanical polishing.

In the case when the first insulator is obtained by thermal oxidation, the substrate 20 does not necessarily need to include trenches 22.

Figure 11:
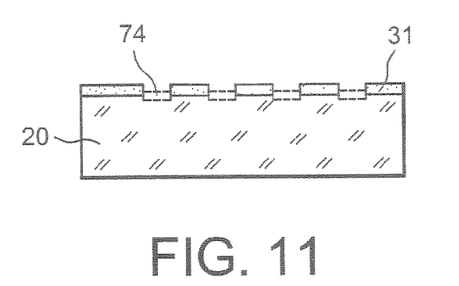

This embodiment is illustrated in FIG. 11, where reference 31 designates a mask, for example in $Si_3N_4$ nitride, on a substrate 20 not etched beforehand. Pads 74 of thermal oxide (indicated as dashed lines in FIG. 11) may be grown by thermal oxidation through the mask 31. During thermal oxidation, oxygen atoms penetrate into the lattice of silicon, which causes swelling of the latter. By this swelling, the surface of the oxide being formed gets closer to the nitride surface of the mask 31.

It may be considered that the height of generated oxide is about twice the height of silicon subject to oxidation.

The rate of formation of the oxide may be controlled, at a rate between 1 nm/min and 10 nm/min.

The mask is then removed, and again the structure of FIG. 10B is found, which may give rise to the steps described above in connection with FIGS. 10C and 10D.

The components obtained according to the methods described in connection with FIGS. 10A-13B may be assembled with a second substrates, as indicated above in connection with FIGS. 7A, 8A, 9A.

Other exemplary embodiments will now be provided

FIRST EXAMPLE

In this first example, the patterns are etched with a reactive ion etching (RIE) type method and have a depth of 50 nanometers in the silicon.

The $SiO_2$ oxide is generated in these patterns and above the bridges by a heat treatment at 900° C. under a steam atmosphere. Its thickness is 120 nanometers (FIG. 6A).

A $SiO_2$ film of 150 nm is deposited by PECVD at the surface of the thermal oxide film (FIG. 6B). The topology (surface relief) may be suppressed by CMP polishing. The surface is then smoothed and the deposited oxide film is polished up to the point where the thermal oxide emerges, the beginning of the so-called mixed oxide area (FIG. 6C).

Densification of the deposited oxide is performed at 900° C. under an oxygen atmosphere for 1 hr.

Complementary thinning is carried out for example by CMP or by HF etching (HF diluted to 10% or even 1%) or by reactive ionic etching, in a $CHF_3$ plasma for example. The complementary thinning causes no or little <<dishing>> between the areas of different oxides (thermal oxide and densified deposited oxide). The complementary thinning is continued after removing the mixed oxide area and is such that a thermal oxide thickness of 10 nm is left at the surface of the bridged areas (FIG. 6D).

The first thereby structured wafer is planar, smooth, and compatible with subsequent molecular bonding. An alternation of fine thermal oxide areas 66 and of thick thermal oxide areas (FIG. 6D) is obtained at its surface. The wafer is then cleaned in order to suppress possible hydrocarbons, to remove particles, to make the surface hydrophilic.

This first structured wafer is then bonded on a second oxidized silicon wafer (thickness of the oxide film is 10 nanometers) cleaned according to the same procedure (FIG. 9A). The stacked structure is submitted to a heat treatment at 1,100° C. for 2 hrs under an argon atmosphere.

The second silicon wafer of this stacked structure is then thinned by a grinding technique so as to for example only leave 25 micrometers of silicon. A stacked structure of the MSOI type (FIG. 9B) is obtained in this way.

SECOND EXAMPLE

In this second example, the patterns are etched with a reactive ion etching (RIE) type method and have a depth of 50 nanometers in the silicon. The oxide is generated in these patterns and above the bridges by heat treatment at 900° C. under a steam atmosphere. Its thickness is 120 nanometers (FIG. 6A).

A 150 nm $SiO_2$ film is deposited by PECVD at the surface of the thermal oxide film. The topology (surface relief) may be suppressed by CMP polishing. The surface is smoothed and the deposited oxide film is polished up to the point where the thermal oxide emerges, the beginning of the so-called mixed oxide area (FIG. 6C).

Densification of the deposited oxide is performed at 900° C. under an oxygen atmosphere for 1 hr.

Complementary thinning is for example carried out by CMP or by HF etching (HF diluted to 10% or even 1%) or by reactive ionic etching, in a $CHF_3$ plasma for example. The complementary thinning causes no or little dishing between the areas of different oxides (thermal oxide and densified deposited oxide). The complementary thinning is continued after removal of the mixed oxide area and is such that a thermal oxide thickness of 10 nm is left at the surface of the bridged areas (FIG. 6D).

The first structured wafer is planar, smooth, compatible with subsequent molecular bonding. An alternation of fine thermal oxide areas and of thick thermal oxide areas 68 is obtained at its surface. The wafer is then cleaned so as to suppress possible hydrocarbons, to remove the particles, to make the surface hydrophilic.

This first structured wafer is then bonded onto a second wafer of non-oxidized silicon, cleaned according to the same procedure. The stacked structure is submitted to a heat treatment at 1,100° C. for 2 hrs under an argon atmosphere. The second silicon wafer of this stacked structure is then thinned by a grinding technique so as to leave for example only 25 micrometers of silicon. An MSOI type stacked structure is obtained in this way.

THIRD EXAMPLE

In this third example, the patterns are etched with a reactive ion etching (RIE) type method and have a depth of 50 nanometers in the silicon. The oxide is generated in these patterns and above the bridges by a heat treatment at 900° C. under a steam atmosphere. Its thickness is 120 nanometers (FIG. 6A).

A 150 nm $SiO_2$ film is deposited by PECVD at the surface of the thermal oxide film. The topology (surface relief) may be suppressed by CMP polishing. The surface is smoothed and the deposited oxide film is polished up to the point where the thermal oxide emerges, the beginning of the so-called mixed oxide area (FIG. 6C).

Densification of the deposited oxide is performed at 900° C. under an oxygen atmosphere for 1 hr.

Complementary thinning is for example carried out by CMP or by HF etching (HF diluted to 10% or even 1%) or by reactive ionic etching, in a $CHF_3$ plasma for example. The complementary thinning causes no or little dishing between the areas of different oxides (thermal oxide and densified deposited oxide). The complementary thinning is continued after removal of the mixed oxide area and is such that at the surface it runs into silicon of the bridged areas (FIG. 6E).

The first structured wafer is planar, smooth, compatible with subsequent molecular bonding and has an alternation of silicon areas and of thermal oxide areas. The wafer is then cleaned so as to suppress possible hydrocarbons, to remove the particles, to make the surface hydrophilic.

This first structured wafer is then bonded onto a second oxidized silicon wafer (thickness of the oxide film is 10 nm), cleaned according to the same procedure (FIG. 8A). The stacked structure is submitted to a heat treatment at 1,100° C. for 2 hrs under an argon atmosphere. The second silicon wafer of this stacked structure is then thinned by a grinding technique so as to leave for example only 25 micrometers of silicon (FIG. 8B). An MSOI type stacked structure is obtained in this way.

In an alternative of this example, this final etching of thermal oxide may be carried out in different ways (for example by CMP, or by plasma, reactive ionic etching, or by chemical etching).

An etching type is selected such that the difference in silicon and oxide etching rates is as small as possible, so as to avoid causing <<dishing>>, from the moment one emerges on the silicon surface of the bridges, a <<dishing>> related to the presence at the surface of both silicon and thermal oxide.

A solution based on diluted HF, for example a 1% HF solution, is possible, but it is delicate to control the stopping of the etching.

A solution based on $NH_4OH/H_2O_2/H_2O$, has an etching rate ratio of only about 2, which is easier to control. In the same way, etching by ion bombardment has a small etching rate difference.

FOURTH EXAMPLE

In this is fourth example, the patterns are etched with a reactive ion etching (RIE) type method and have a depth of 50 nanometers in the silicon. The oxide is generated in these patterns and above the bridges by a heat treatment at 900° under a steam atmosphere. Its thickness is 120 nanometers (FIG. 6A).

A 150 nm $SiO_2$ film is deposited by PECVD at the surface of the thermal oxide film (FIG. 6B). The topology (surface relief) may be suppressed by CMP polishing. The surface is smooth and the deposited oxide film is polished up to the point where the thermal oxide emerges, the beginning of the so-called mixed oxide area (FIG. 6C).

Densification of the deposited oxide is performed at 900° C. under an oxygen atmosphere for 1 hr.

Complementary thinning is for example carried out by CMP or by HF etching (HF diluted to 10% or even 1%) or by reactive ionic etching, in a $CHF_3$ plasma for example. The complementary thinning causes no or little dishing between the areas of different oxides (thermal oxide and densified deposited oxide). The complementary thinning is continued after removal of the mixed oxide area and is such that at the surface it runs into silicon of the bridged areas (FIG. 6E).

The first structured wafer is planar, smooth, compatible with subsequent molecular bonding and has an alternation of silicon areas and of thermal oxide areas.

The wafer is then cleaned in order to suppress possible hydrocarbons, to remove particles, to make the surface hydrophilic. This first structured wafer is then bonded onto a second non-oxidized silicon wafer cleaned according to the same procedure (FIG. 7A). The stacked structure is submitted to a heat treatment at 1,100° C. for 2 hrs under an argon atmosphere.

In addition, if the heat treatment is carried out at a high temperature (for example greater than or equal to 1,100° C.) the extremely fine residual oxide may be caused to disappear at the bonding interface, in the areas corresponding to the bridges.

With a view to facilitate disappearance of this possible interface oxide, one will try as much as possible to minimize the crystallographic misalignment between both bonded silicon wafers. The second silicon wafer of this stacked structure will then be thinned by a grinding technique so as to leave for example only 25 micrometers of silicon. A PSOI type stacked structure (FIG. 7B) is obtained in this way.

FIFTH EXAMPLE

In this fifth example, the patterns are etched with a reactive ion etching (RIE) type method and have a depth of 50 nanometers in the silicon. The oxide is generated in these patterns and above the bridges by a heat treatment at 900° C. under a steam atmosphere. Its thickness is 120 nanometers (FIG. 6A).

A 150 nm $SiO_2$ film is deposited by PECVD at the surface of the thermal oxide film. The topology (surface relief) may be suppressed by CMP polishing. The surface is smooth and the deposited oxide film is polished up to the point where the thermal oxide emerges, the beginning of the so-called mixed oxide area (FIG. 6C).

Densification of the deposited oxide is performed at 900° C. under an oxygen atmosphere for 1 hr.

Complementary thinning is for example carried out by CMP or by HF etching (HF diluted to 10% or even 1%) or by reactive ionic etching, in a $CHF_3$ plasma for example. The complementary thinning causes no or little dishing between the areas of different oxides (thermal oxide and densified deposited oxide). The complementary thinning is continued after removal of the mixed oxide area and is such that at the surface it runs into silicon of the bridged areas (FIG. 6E).

The first structured wafer is planar, smooth, compatible with subsequent molecular bonding, and has an alternation of silicon areas 26 and of thermal oxide areas 54. The wafer is then cleaned in order to suppress possible hydrocarbons, to remove the particles, to make the surface hydrophilic.

The second silicon wafer is oxidized over a thickness of 20 nm (FIG. 8A). It is then submitted to implantation via ionic bombardment of hydrogen (energy 70 keV, dose $5.10^{16}$ at/cm$^2$. The first structured wafer is then bonded on the second oxidized silicon wafer, implanted, cleaned, with a view to molecular bonding.

The stacked structure is for example submitted to a heat treatment at 500° C. for 30 min under an argon atmosphere. Fracture is then induced in the second silicon wafer. After various steps described in the SmartCut™ technology, a 50 nm thick silicon surface film is obtained. An MSOI type stacked structure is obtained in this way, with in particular locally very fine oxide and silicon areas (FIG. 8B).

SIXTH EXAMPLE

In this sixth example, the patterns are etched with a reactive ion etching (RIE) tape method and have a depth of 100 nanometers in the silicon. The oxide is generated in these patterns and above the bridges by a heat treatment at 900° C. under a steam atmosphere. Its thickness is 120 nanometers. The surface topology has a height of 100 nm (FIG. 6A).

A 300 nm SiO$_2$ film is deposited by PECVD at the surface of the thermal oxide film. The topology (surface relief) may be suppressed by CMP polishing. The surface is smooth and the deposited oxide film is polished up to the point where the thermal oxide emerges, the beginning of the so-called mixed oxide area (FIG. 6C).

Densification of the deposited oxide is performed at 900° C. under an oxygen atmosphere for 1 hr.

Complementary thinning is for example carried out by CMP or by HF etching (HF diluted to 10% or even 1%) or by reactive ionic etching, in a CHF$_3$ plasma for example. The complementary thinning causes no or little dishing between the areas of different oxides (thermal oxide and densified deposited oxide). The complementary thinning is continued after removal of the mixed oxide area and is such that at the surface it runs into silicon of the bridged areas (FIG. 6E).

The first structured wafer is planar, smooth, compatible with subsequent molecular bonding and has an alternation of silicon areas and of thermal oxide areas. The wafer is then cleaned so as to suppress possible hydrocarbons, to remove the particles, to make the surface hydrophilic. The second silicon wafer is oxidized over a thickness of 20 nm.

It is then submitted to implantation by ionic bombardment of hydrogen (energy 70 keV, dose $5.10^{16}$ at/cm$^2$). The first structured wafer is then bonded onto the second oxidized silicon wafer (FIG. 8A), implanted, cleaned, with a view to molecular bonding. The stacked structure is for example submitted to a heat treatment at 500° C. for 30 min under an argon atmosphere. Fracture is then induced in the second silicon wafer.

After various steps described in SmartCut™ technology (see for example the article by Auberton Hervé et al., mentioned in the introduction to the present application), a surface silicon film with a thickness of 50 nm is obtained. An MSOI type structure is obtained in this way with in particular locally very fine oxide and silicon areas (FIG. 8B).

The invention claimed is:

1. A method for producing a semiconducting structure, on a semiconducting substrate having a surface topology comprising patterns of depth p, this method including:
    a) a step for forming a first layer in a first insulating material on said surface,
    b) a step for forming a second layer on the first layer, in a second insulating material, less dense than the first insulating material, said second layer having a thickness of less than 3.5 times the depth p,
    c) a step for thinning the assembly.

2. The method according to claim 1, the first insulator layer being a layer in accordance with the topology of the substrate.

3. The method according to claim 1, the thinning step being preceded with a step for densifying the second insulating material.

4. The method according to claim 1, the first insulating material being thermal oxide SiO$_2$.

5. The method according to claim 1, the insulating material being in Al$_2$O$_3$, or AlN, or SiON, or Si$_3$N$_4$, or diamond, or HfO$_2$, or in a dielectric material with a high dielectric constant.

6. The method according to claim 1, the semiconducting material being in silicon or in Si$_{1-x}$Ge$_x$(0<x<1).

7. The method according to claim 1, the first substrate including areas with different dopings.

8. The method according to claim 1, wherein the patterns are separated by bridges.

9. The method according to claim 8, the etched patterns having a depth between 1 nm and 10 µm.

10. The method according to claim 8, the etched patterns having a width between 1 µm and 5 mm.

11. The method according to claim 1, the substrate being a composite substrate.

12. The method according to claim 11, including a surface insulating film.

13. The method according to claim 1, step c) leaving a layer of first insulator on the surface.

14. The method according to claim 13, further including an additional thinning step, leaving an alternation of semiconducting areas and of insulating areas on the surface.

15. The method according to claim 1, the second insulating material being deposited oxide SiO$_2$.

16. The method according to claim 15, the oxide being deposited by plasma vapor phase deposition.

17. The method according to claim 1, further including an assembly step with a second substrate.

18. The method according to claim 17, the assembly being achieved by molecular adhesion.

19. The method according to claim 17, an insulating film being formed on at least one of the two substrates.

20. The method according to claim 17, the first substrate having at least one area of a first type of conductivity, and the second substrate having at least one area of the opposite conductivity type.

21. The method according to claim 17, the second substrate being in a second semiconducting material.

22. The method according to claim 21, the second substrate further including an insulator layer on the second semiconducting material.

23. The method according to claim 17, further including a step for thinning the first and/or the second substrate.

24. The method according to claim 23, the thinning step being achieved by polishing or etching.

25. The method according to claim 23, the step for thinning either one or both of the substrates being performed by forming an embrittlement layer or area.

26. The method according to claim 25, the embrittlement layer or area being produced by a layer of porous silicon.

27. The method according to claim 25, the formation of an embrittlement layer or area being produced by ion implantation in the first or second substrate.

28. The method according to claim 27, the implanted ions being hydrogen ions or a mixture of hydrogen ions and helium ions.

29. A method for producing a semiconducting structure, comprising the formation:
- a1) of a first insulating area in a semiconducting substrate,
- b1) and then the formation of at least a second insulating area in the same substrate, steps a1) and b1) being carried out according to claim 1.

30. The method according to claim 29, steps a1) and b1) being carried out with different masks.

31. The method according to claim 29, at least two of the formed insulating areas having different depths and/or widths in the substrate and/or being for formed with different insulating materials.

32. A method for producing a semiconducting structure, on a semiconducting substrate having pads in a first insulating material protruding at a height h above the surface of the substrate, this method including:
- a) a step for forming a second layer, on the substrate and the pads, in a second insulating material, less dense than the first insulating material, the second layer having a thickness of less than 3.5 time the height h,
- b) a step for thinning the assembly.

33. The method according to claim 32, wherein the pads are formed in etched areas of the semiconducting area.

34. The method according to claim 32, the pads being formed by thermal oxidation of the semiconducting substrate, or the pads being for formed by LPCVD and the second insulating material layer in PECVD.

35. The method according to claim 32, step b) leaving a second insulating material layer at the surface or leaving at the surface an alternation of second insulating material areas and of first insulating material areas.

36. The method according to claim 32, the thinning step being preceded with a step for densifying the second insulating material.

37. The method according to claim 32, the first insulating material being thermal oxide $SiO_2$.

38. The method according to claim 32, the insulating material being in $Al_2O_3$, or AlN, or SiON, or $Si_3N_4$, or diamond, or $HfO_2$, or in a dielectric material with a high dielectric constant.

39. The method according to claim 32, the semiconducting material being in silicon or in $Si_{1-x}Ge_x (0<x<1)$.

40. The method according to claim 32, the first substrate including areas with different dopings.

41. The method according to claim 32, the second insulating material being deposited oxide $SiO_2$.

42. The method according to claim 41, the oxide being deposited by plasma vapor phase deposition.

43. A method for producing a semiconducting structure, comprising the formation:
- a1) of a first insulating area in a semiconducting substrate,
- b1) and then the formation of at least a second insulating area in the same substrate,
steps a1) and b1) being carried out according to claim 32.

44. The method according to claim 43, steps a1) and b1) being carried out with different masks.

45. The method according to claim 43, at least two of the formed insulating areas having different depths and/or widths in the substrate and/or being formed with different insulating materials.

46. The method according to claim 32, further including an assembly step with a second substrate.

47. The method according to claim 46, the assembly being achieved by molecular adhesion.

48. The method according to claim 46, an insulating film being formed on at least one of the two substrates.

49. The method according to claim 46, the first substrate having at least one area of a first type of conductivity, and the second substrate having at least one area of the opposite conductivity type.

50. The method according to claim 46, the second substrate being in a second semiconducting material.

51. The method according to claim 50, the second substrate further including an insulator layer on the second semiconducting material.

52. The method according to claim 46, further including a step for thinning the first and/or the second substrate.

53. The method according to claim 52, the thinning step being achieved by polishing or etching.

54. The method according to claim 52, the step for thinning either one or both of the substrates being performed by for forming an embrittlement layer or area.

55. The method according to claim 54, the embrittlement layer or area being produced by a layer of porous silicon.

56. The method according to claim 54, the formation of an embrittlement layer or area being produced by ion implantation in the first or second substrate.

57. The method according to claim 56, the implanted ions being hydrogen ions or a mixture of hydrogen ions and helium ions.

* * * * *